United States Patent
Koshiyama et al.

[11] Patent Number: 6,117,623
[45] Date of Patent: Sep. 12, 2000

[54] REMOVER SOLVENT FOR PARTIAL REMOVAL OF PHOTORESIST LAYER

[75] Inventors: Jun Koshiyama; Futoshi Shimai, both of Chigasaki; Hidehito Fukushima, Kanagawa-ken, all of Japan

[73] Assignee: Tokyo Ohka Kogyo Co., Ltd., Kawasaki, Japan

[21] Appl. No.: 09/453,460

[22] Filed: Dec. 2, 1999

[30] Foreign Application Priority Data

Dec. 2, 1998 [JP] Japan .................................. 10-343288

[51] Int. Cl.$^7$ ................................. G03F 7/42; C11D 7/08
[52] U.S. Cl. ........................... 430/331; 510/176; 134/1.3
[58] Field of Search ........................... 430/331; 510/176; 134/1.3

[56] References Cited

U.S. PATENT DOCUMENTS

| | | | |
|---|---|---|---|
| 5,268,260 | 12/1993 | Bantu et al. | 430/325 |
| 5,571,417 | 11/1996 | Bhatt et al. | 210/620 |
| 5,849,467 | 12/1998 | Sato et al. | 430/327 |
| 5,849,487 | 12/1998 | Sato et al. | 430/327 |
| 5,866,305 | 2/1999 | Chon et al. | 430/331 |

FOREIGN PATENT DOCUMENTS

| | | |
|---|---|---|
| 6-346091 | 12/1994 | Japan . |
| 8-171213 | 7/1995 | Japan . |
| 9-311470 | 12/1997 | Japan . |

*Primary Examiner*—Janet Baxter
*Assistant Examiner*—Rosemary Ashton
*Attorney, Agent, or Firm*—Wenderoth, Lind & Ponack, L.L.P.

[57] ABSTRACT

While it is important in the photolithographic patterning of a photoresist layer on a substrate surface for the manufacture of various electronic devices that the pattern-wise light exposure of the photoresist layer is preceded by partial removal of the photoresist layer on the non-patterning areas such as marginal areas, peripheral areas and back surface opposite to the surface for resist patterning by dissolving away the extraneous photoresist layer with a remover solvent, the invention proposes an improvement in the partial removal of the photoresist layer by using a specific organic solvent or solvent mixture selected relative to the surface tension of the solvent which, in particular, is a mixture of γ-butyrolactone and anisole in a mixing ratio of 70:30 to 97:3 by weight.

9 Claims, No Drawings

REMOVER SOLVENT FOR PARTIAL REMOVAL OF PHOTORESIST LAYER

BACKGROUND OF THE INVENTION

The present invention relates to a novel and unique remover solvent for partial removal of a photoresist layer on a substrate or, more particularly, to a remover solvent suitable for partial removal of a photoresist layer from the marginal areas, peripheral areas and/or back surface of a substrate prior to pattern-wise light exposure of the photoresist layer in the photolithographic patterning process for the manufacture of, for example, semiconductor devices such as ICs, LSIs and the like and liquid crystal display panels.

As is well known, a typical procedure of the above mentioned photolithographic patterning process in the manufacture of semiconductor devices is as follows. Namely, a substrate plate such as a semiconductor silicon wafer is coated on one surface with a photoresist composition in the form of a solution followed by drying to form a dried photoresist layer on the substrate surface. Subsequently, the photoresist layer is pattern-wise exposed to actinic rays to effect an increase or decrease in the solubility of the resist layer in a developer solution.

In the above mentioned coating step of the substrate surface with a photoresist solution, it is always the case that the photoresist solution is deposited not only onto the areas of the substrate surface intended for patterning, referred to as the patterning areas hereinafter, but also onto the areas not intended for patterning, referred to as the non-patterning areas hereinafter, such as marginal areas, peripheral areas and, sometimes, back surface of the substrate. Accordingly, it is very important that the photoresist layer formed on the non-patterning areas, referred to as the extraneous resist layer hereinafter, is removed, prior to the pattern-wise light exposure of the photoresist layer, by dissolving away with a remover solvent in order not to adversely affect the working efficiency in the subsequent processing steps.

A great variety of solvents are proposed and currently employed either singly or as a mixture of two kinds or more for use as the remover solvent. For example, propyleneglycol monomethyl ether acetate or a mixture thereof with propyleneglycol monomethyl ether is recommended and widely employed as a remover solvent in respect of the low toxicity to ensure excellent safety to the workers' health. When the remover solvent of this type is employed in the manufacture of a liquid crystal display panels by forming a photoresist layer on a glass substrate, drawbacks are sometimes encountered. For example, the remover solvent is absorbed in the photoresist layer on the patterning areas so that swelling of the photoresist layer left unremoved takes place along the boundary lines with the non-patterning area from which the extraneous photoresist layer has been removed by the remover solvent and consequently the periphery of the photoresist layer on the patterning areas cannot be orthogonal standing vertically on the substrate surface. Even worse, it is sometimes the case that the photoresist layer on the patterning areas is also partly dissolved away by the remover solvent.

With an object to overcome the above mentioned drawbacks in the use of conventional remover solvents, the inventors previously proposed use of an aqueous solution containing a basic compound and dipropyleneglycol mono (lower alkyl) ether as a remover solvent in Japanese Patent Kokai 9-269601 and 9-311470, respectively. Although these remover solvents are effective to solve the problems in the prior art remover solvents, it is desired in recent years to accomplish higher and higher productivity in the pre-exposure partial removal of the extraneous photoresist layer by decreasing the time taken for dissolving away the photoresist layer with a remover solvent. The inventors accordingly have continued investigations to develop a novel remover solvent of increased dissolving power leading to completion of the present invention.

The remover solvent as the target of the above mentioned development works must satisfy various requirements that partial removal of the photoresist layer in the non-patterning areas can be completed desirably within 6 seconds or shorter, that orthogonality is ensured of the periphery of the photoresist layer left unremoved on the patterning areas of the substrate surface, that the remover solvent is never absorbed in the photoresist layer left unremoved by the remover solvent, that no or little scums are formed after partial removal of the photoresist layer, that the remover solvent has good vaporizability not to prolongedly remain on the substrate surface so as to accelerate completion of the partial removal works, and so on.

SUMMARY OF THE INVENTION

The present invention accordingly has an object to provide a novel remover solvent for partial removal of a photoresist layer on the surface of a substrate as well as to provide a novel method for the partial removal of a photoresist layer on the surface of a substrate by using the remover solvent.

Thus, the novel remover solvent provided by the present invention for partial removal of a photoresist layer on the surface on a substrate is a mixture consisting of (a) from 70 to 97% by weight of a lactone compound such as γ-butyrolactone and (b) from 30 to 3% by weight of an organic solvent selected from alkoxybenzenes and aromatic alcohols or, preferably, anisole.

The present invention further provides an improvement, in a method for partial removal of a photoresist layer formed on the surface of a substrate from non-patterning areas, such as marginal areas, peripheral areas and back surface of the substrate, comprising the steps of: bringing the photoresist layer on the non-patterning areas into contact with a remover solvent to dissolve away the photoresist layer; and evaporating the remover solvent left on the substrate surface to dryness, which comprises using, as the remover solvent, a mixture consisting of (8a) from 70 to 97% by weight of a lactone compound such as γ-butyrolactone and (b) from 30 to 3% by weight of an organic solvent selected from alkoxybenzenes and aromatic alcohols or, preferably, anisole.

DETAILED DESCRIPTION OF THE PREFERRED EMBODIMENTS

As is described above, the inventors have conducted extensive investigations to develop a novel remover solvent for partial removal of a photoresist layer from non-patterning areas of the substrate surface and arrived at a discovery that the surface tension of the solvent has significance on the performance thereof as a remover solvent to find that the surface tension of the solvent should be in the range from 35 to 60 dynes/cm at 20° C. in order to exhibit excellent performance as a remover solvent leading to completion of the present invention on the base of the discovery after continuing experimental studies to make choice of solvents or solvent mixtures.

The substrate material and the photoresist composition to form a photoresist layer on the substrate surface, to which the method of the present invention is applied, are not particularly limitative and can be any one selected from those conventionally employed in the conventional photolithographic patterning works for the manufacture of electronic devices. The method for the formation of a photoresist layer on the substrate surface and the photolithographic patterning method are also not particularly limitative and can be conventional.

In practicing the method of the present invention, a photoresist layer is formed on the surface of a substrate and the photoresist layer on the non-patterning areas, such as marginal areas, peripheral areas and back surface, of the substrate is brought into contact with a remover solvent in order to be dissolved away by the solvent. It is essential that the remover solvent has a surface tension in the range from 35 to 60 dynes/cm at 20° C. When a solvent having a surface tension smaller than 35 dynes/cm at 20° C., such as methyl 2-methyl-3-methoxypropionate and a mixture of ethyl lactate, ethyl 3-ethoxypropionate and γ-butyrolactone used in the prior art, is employed as the remover solvent, the remover solvent sometimes infiltrates into and partly dissolves away the photoresist layer in the patterning areas not to be dissolved away when the photoresist layer in the non-patterning areas is brought into contact with the remover solvent. When the surface tension of the remover solvent is too high, on the other hand, the solvent has poor infiltrability into the photoresist layer so that the process of dissolving away the photoresist layer in the non-patterning areas takes a longer time adversely affecting the productivity of the process.

Following is a listing of some of the organic solvents, from which the remover solvent in the present invention should be selected, having a surface tension in the range from 35 to 60 dynes/cm at 20° C. given within the brackets: γ-butyrolactone (43.9 dynes/cm); anisole (35.2 dynes/cm); benzyl alcohol (38.94 dynes/cm); dimethylsulfoxide (42.8 dynes/cm); N-methylpyrrolidone (41 dynes/cm); and formamide (58.6 dynes/cm), which can be used either singly or as a mixture of two kinds or more. Further, these organic solvents can be used as mixed with another organic solvent having a smaller surface tension such as phenetole having a surface tension of 32.85 dynes/cm at 20° C. provided that the solvent mixture has a surface tension within the above specified range.

It is preferable that the inventive remover solvent is a mixture of (a) from 70 to 97% by weight of γ-butyrolactone and (b) from 30 to 3% by weight of a solvent selected from the group consisting of alkoxybenzenes and aromatic alcohols, such as anisol and benzyl alcohol, or, more preferably, from 90 to 97% by weight of the former solvent and from 10 to 3% by weight of the latter solvent which preferably is anisole.

The present invention is applicable to the photolithographic patterning process of any electronic devices including semiconductor devices based on a semiconductor silicon wafer and display devices as well as photomasks bearing a pattern on a fused silica glass plate as the substrate without particular limitations. Examples of the electronic display devices to which the present invention is applicable include: liquid-crystal displays (LCD); plasma display panels (PDP); light-emitting diodes (LED); electroluminescent displays (ELD); field-emission displays (FED) and the like. The material of the substrate for the flat display panels can be a glass plate or a transparent plastic plate. The method according to the inventions applicable most successfully to rectangular flat panels.

The photoresist composition to form the photoresist layer, to which the present invention is applicable for partially dissolving away by using the remover solvent comprises a film-forming resinous ingredient and a photosensitive compound as is the case for conventional photoresist compositions capable of being developed with an aqueous alkaline developer solution. The present invention is of course applicable to the positive-working photoresist compositions containing, in particular, a quinonediazide-based photosensitive compound to meet the requirement for modern photoresist compositions suitable for extra-fine photolithographic patterning.

Examples of the quinonediazide group-containing compound as the photosensitive compound contained in the photoresist compositions include partial or complete esterification products or amidation products between an aromatic compound having phenolic hydroxyl groups or amino groups and a sulfonic acid of a quinonediazide compound such as o-benzoquinonediazide, o-naphthoquinonediazide and o-anthraquinonediazide. Examples of the above mentioned aromatic compound having phenolic hydroxyl groups or amino groups include polyhydroxybenzophenones such as 2,3,4-trihydroxybenzophenone, 2,2',4,4'-tetrahydroxybenzophenone and 2,3,4,4'-tetrahydroxybenzophenone, alkyl gallates, aryl gallates, phenol, p-methoxyphenol, dimethylphenols, hydroquinone, bisphenol A, naphthols, pyrocatechol, pyrogallol, pyrogallol monomethyl ether, pyrogallol 1,3-dimethyl ether, gallic acid, esters and ethers of gallic acid having a part of the hydroxyl groups left unesterified or unetherified, aniline, p-aminodiphenylamine and the like. Particularly preferable quinonediazide group-containing compounds include partial or complete esterification products of the above mentioned polyhydroxybenzophenone with naphthoquinone-1,2-diazido-5-sulfonyl chloride or naphthoquinone-1,2-diazido-4-sulfonyl chloride, of which those having an average degree of esterification of 70% or higher are more preferable.

Various kinds of alkali-soluble resins are known and used as the film-forming resinous ingredient in the photoresist compositions including novolak resins obtained from a phenolic compound such as phenol, cresol and xylenol and an aldehyde such as formaldehyde, acrylic resins, copolymers of styrene and acrylic acid, homo- and copolymers of hydroxystyrene, poly(vinyl hydroxybenzoates) and poly (vinyl hydroxybenzals).

A particularly preferable film-forming resinous ingredient in the positive-working photoresist composition, to which the present invention is applicable, is a cresol novolak resin having, more preferably, a weight-average molecular weight of 2000 to 20000 or, most preferably, 5000 to 15000 after fractionating removal of low molecular-weight fractions.

A typical formulation of the above mentioned positive-working photoresist composition include 100 parts by weight of the film-forming resinous ingredient and from 10 to 40 parts by weight or, preferably, from 15 to 30 parts by weight of the photosensitive compound. When the amount of the photosensitive compound is too large relative to the resinous ingredient a great decrease is caused in the photosensitivity of the photoresist composition in the pattern-wise exposure of the photoresist layer to light while, when the amount thereof is too small, the patterned resist layer would not have a desirable orthogonal cross sectional profile.

It is optional according to need that the photoresist composition is admixed with a variety of additives having compatibility and added to conventional photoresist compositions including dyes such as coumarine dyes and azo dyes, auxiliary resins, plasticizers, stabilizers, coloring agents and contrast improvers to increase visibility of the patterned resist layer.

Coating of the substrate surface with the above described photoresist composition is performed by using a suitable coating machine not particularly limitative including spinners, bar coaters, roller coaters and the like, of which spinners are preferred in most cases.

The coating layer of the photoresist composition formed on the substrate surface is then subjected to drying to form a dried photoresist layer by evaporating the solvent from the coating layer. When the photoresist layer is subjected according to the present invention to partial removal of the photoresist layer on the non-patterning areas such as marginal areas, peripheral areas and back surface of the substrate, it is advantageous that the photoresist layer is not in a completely dried state but in an incompletely dried or semi-dried state leaving a part of the solvent in the layer left unevaporated by adequately controlling the drying conditions.

Partial removal of the thus formed photoresist layer on the substrate surface from non-patterning areas such as marginal areas, peripheral areas and back surface of the substrate with the remover solvent is performed, though not particularly limitative, by the following methods including:

(1) moving a jet nozzle from which the remover solvent is ejected along the periphery of the substrate plate;

(2) ejecting the remover solvent from a jet nozzle at the back surface of the substrate plate under rotation above the jet nozzle;

(3) horizontally moving a pool of the remover solvent filling a slit of remover machine so as to bring the remover solvent into contact with the periphery of the substrate plate held in a stationary state (see Japanese Patent Kokai 8-102434);

(4) holding the substrate plate at the opposite peripheries each inserted into a pool of the remover solvent filling a slit of a remover machine and moving the substrate plate in such a direction that the peripheries thereof are moved by sliding in contact with the remover solvent held in the slits; and (5) lowering the substrate plate held in a vertical disposition and dipping the lower marginal area of the substrate plate into the remover solvent contained in a vat below the substrate to be kept therein for a while, of which the method (3) is particularly effective in most cases.

The above described procedure for the partial removal of the photoresist layer on the substrate surface from the non-patterning areas with the remover solvent followed by evaporation of the solvent precedes a conventional photolithographic patterning work to give a patterned resist layer including the steps of a pre-exposure baking treatment, pattern-wise light exposure of the photoresist layer, post-exposure baking treatment, if necessary, and development treatment followed by rinsing and drying.

In the following, the present invention is described in more detail by way of examples.

EXAMPLES 1 TO 5 AND COMPARATIVE EXAMPLES 1 TO 5

A chromium-plated rectangular glass substrate plate having dimensions of 550 mm by 650 mm was coated on the chromium-plated surface with a positive-working photoresist solution (OFPR PR-11, a product by Tokyo Ohka Kogyo Co.) containing a cresol novolak resin and a quinonediazide group-containing photosensitive compound in such a coating amount that the coating layer after complete drying should have a thickness of 1.1 $\mu$m followed by a controlled evaporation treatment of the solvent under a reduced pressure to form a semi-dry coating layer of the photoresist composition on the substrate surface.

The glass substrate plate having the thus formed semi-dry photoresist layer was mounted on a partial photoresist remover machine EBR of a through-processing system for rectangular substrates (TR-36000, manufactured by Tokyo Ohka Kogyo Co.) by inserting the opposite marginal areas of the substrate plate in a horizontal direction into the slits of the machine filled with a remover solvent so as to have the marginal areas in contact with the remover solvent for a specified length of time in seconds at 23° C. followed by evaporation of the solvent under reduced pressure to give a substrate plate from which the photoresist layer on the marginal areas had been dissolved away.

The remover solvents used in each of these Examples and Comparative Examples were shown in the following together with the surface tension of the solvent or solvent mixture at 20° C. given in the brackets.

EXAMPLE 1

γ-butyrolactone (43.9 dynes/cm)

EXAMPLE 2

97:3 by weight mixture of γ-butyrolactone and anisole (43.3 dynes/cm)

EXAMPLE 3

95:5 by weight mixture of γ-butyrolactone and anisole (43.0 dynes/cm)

EXAMPLE 4

85:15 by weight mixture of γ-butyrolactone and anisole (42.5 dynes/cm)

EXAMPLE 5

95:5 by weight mixture of γ-butyrolactone and benzyl alcohol (42.9 dynes/cm)

COMPARATIVE EXAMPLE 1 ethyl lactate (29.60 dynes/cm)

COMPARATIVE EXAMPLE 2 dipropyleneglycol monomethyl ether (28.8 dynes/cm)

COMPARATIVE EXAMPLE 3

50:50 by weight mixture of ethyl lactate and methyl 3-methoxypropionate (28 dynes/cm)

COMPARATIVE EXAMPLE 4 propyleneglycol monomethyl ether acetate (26.4 dynes/cm)

COMPARATIVE EXAMPLE 5

30:70 by weight mixture of propyleneglycol monomethyl ether acetate and propyleneglycol monomethyl ether (27 dynes/cm)

The substrate plates after the above described partial removal treatment of the photoresist layer were visually inspected for the following items to give the results in three or two ratings shown in Table 1 together with the contacting time of the photoresist layer with the remover solvent in seconds.

Item 1: Completeness of removal of the photoresist layer was rated as A for complete removal; B for substantially full but not complete removal; and C for poor removal.

Item 2: Occurrence of scums was rated as A for absolute absence of scums; B for occurrence of a small amount of scums; and C for occurrence of a large amount of scums.

Item 3: Removal of photoresist layer in patterning areas was rated as A for non-removal and B for removal.

Item 4: Cross sectional profile along the periphery of unremoved photoresist layer was rated as A for absence of a raise along the periphery and B for occurrence of a raise along the periphery as measured by using a probe-type cross sectional level difference tester for the test specimen after the partial removal treatment of the photoresist layer.

Item 5: Dryability of the remover solvent was rated as A for complete dryness, B for remaining of a little amount of the remover solvent and C for remaining of a large amount of the remover solvent on the substrate surface as visually inspected after 6 seconds standing of the substrate plate taken out of the slits of the remover machine after holding the marginal areas in contact with the remover solvent for the contacting time indicated in Table 1.

TABLE 1

|  |  | Contacting time, seconds | Completeness of removal | Occurrence of scums | Removal of photoresist layer | Cross sectional profile | Dryability |
|---|---|---|---|---|---|---|---|
| Example | 1 | 6 | B | A | A | A | A |
|  | 2 | 4 | A | A | A | A | A |
|  | 3 | 3 | A | A | A | A | A |
|  | 4 | 3 | A | B | A | A | A |
|  | 5 | 3 | A | A | A | A | B |
| Comparative Example | 1 | 3 | A | C | B | B | B |
|  | 2 | 6 | B | A | A | A | C |
|  | 3 | 3 | A | C | B | B | B |
|  | 4 | 3 | A | C | B | B | B |
|  | 5 | 2 | A | A | B | B | A |

What is claimed is:

1. A remover solvent for partial removal of a photoresist layer formed on the surface of a substrate plate which is a mixture of (a) a first organic solvent selected from lactone compounds and (b) a second organic solvent selected from the group consisting of alkoxybenzenes and aromatic alcohols in a mixing ratio in the range from 70:30 to 97:3 by weight.

2. The remover solvent as claimed in claim 1 in which the first organic solvent is γ-butyrolactone.

3. The remover solvent as claimed in claim 1 in which the second organic solvent is anisole.

4. The remover solvent as claimed in claim 1 in which the mixing ratio of the first organic solvent to the second organic solvent is in the range from 90:10 to 97:3 by weight.

5. In a method for partial removal of a photoresist layer from marginal areas, peripheral areas and back surface opposite to the surface on which a photoresist layer is formed for photolithographic patterning by bringing the photoresist layer on the non-patterning areas into contact with a remover solvent, the improvement which comprises using an organic solvent or a mixture of organic solvents having a surface tension in the range from 35 to 60 dynes/cm at 20° C. and selected from the group consisting of lactones, alkoxybenzenes and aromatic alcohols as the remover solvent.

6. The improvement as claimed in claim 5 in which the remover solvent is a mixture of (a) a first organic solvent selected from lactones and (b) a second organic solvent selected from the group consisting of alkoxybenzenes and aromatic alcohols in a mixing ratio in the range from 70:30 to 97:3 by weight.

7. The improvement as claimed in claim 6 in which the first organic solvent is γ-butyrolactone.

8. The improvement as claimed in claim 6 in which the second organic solvent is anisole.

9. The improvement as claimed in claim 6 in which the mixing ratio of the first organic solvent to the second organic solvent in the range from 90:10 to 97:3 by weight.

* * * * *